(12) United States Patent
Chen et al.

(10) Patent No.: US 8,455,342 B2
(45) Date of Patent: Jun. 4, 2013

(54) MASK ROM FABRICATION METHOD

(75) Inventors: Kuang-Chu Chen, Hsinchu (TW);
Cheng Tao Chen, Hsinchu (TW);
Chung-Lung Hsu, Hsinchu (TW);
Chun-Yao Chiu, Hsinchu County (TW);
Chin-Yung Chang, Hsinchu (TW)

(73) Assignees: Nyquest Technology Corporation Limited, Hsinchu (TW); Nuvoton Technology Corporation, Hsinchu (TW)

( * ) Notice: Subject to any disclaimer, the term of this patent is extended or adjusted under 35 U.S.C. 154(b) by 87 days.

(21) Appl. No.: 13/274,857

(22) Filed: Oct. 17, 2011

(65) Prior Publication Data
US 2013/0095628 A1    Apr. 18, 2013

(51) Int. Cl.
*H01L 21/3205* (2006.01)

(52) U.S. Cl.
USPC ........... 438/587; 438/262; 438/299; 438/301; 257/E21.671; 257/E21.673

(58) Field of Classification Search
USPC .................. 257/E21.671, E21.673; 438/262, 438/299, 301, 587
See application file for complete search history.

(56) References Cited

U.S. PATENT DOCUMENTS

| | | | |
|---|---|---|---|
| 5,514,610 A | 5/1996 | Wann et al. | |
| 5,578,402 A * | 11/1996 | Watanabe | 430/5 |
| 5,585,297 A * | 12/1996 | Sheng et al. | 438/278 |
| 6,312,990 B1 * | 11/2001 | Kim et al. | 438/257 |

* cited by examiner

*Primary Examiner* — Robert Huber
(74) *Attorney, Agent, or Firm* — Muncy, Geissler, Olds & Lowe, PLLC

(57) ABSTRACT

A mask ROM fabrication method which comprises steps: sequentially forming a gate dielectric layer and a first photoresist layer on a substrate; letting a light having a wavelength of 365 nm pass through a first phase shift mask to photolithographically form on the first photoresist layer a plurality of first trenches having a width of 243-365 nm; doping the substrate to form a plurality of embedded bit lines having a width of 243-365 nm; removing the first photoresist layer; sequentially forming a polysilicon layer and a second photoresist layer on the gate dielectric layer; and letting the light pass through a second phase shift mask to photolithographically form a plurality of polysilicon word lines on the polysilicon layer. Thereby is reduced the line width of mask ROM to 243-365 nm and decreased the area of mask ROM.

10 Claims, 18 Drawing Sheets

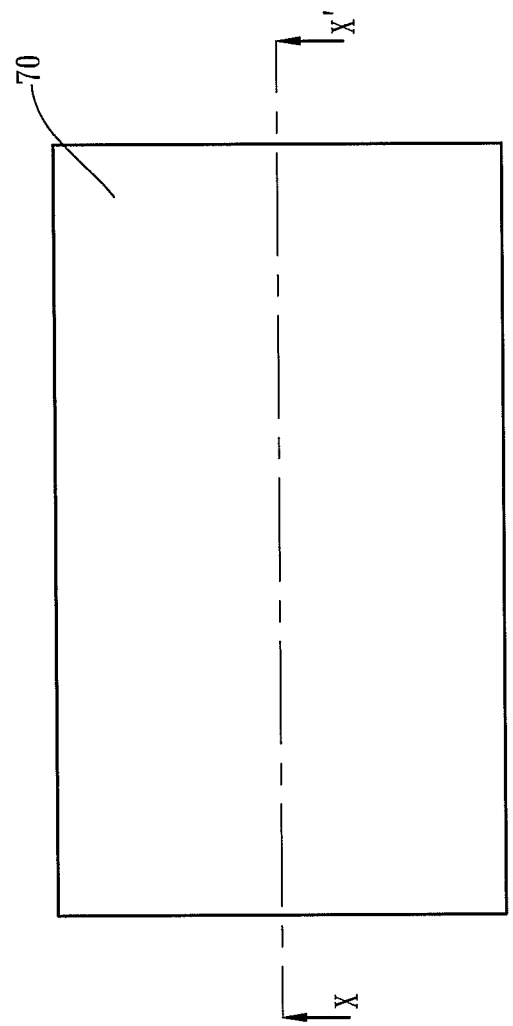

MASK ROM FABRICATION METHOD

FIELD OF THE INVENTION

The present invention relates to a mask ROM technology, particularly to a mask ROM fabrication method.

BACKGROUND OF THE INVENTION

Memories may be categorized into ROM (Read Only Memory) and RAM (Random Access Memory). ROM can keep data without electricity. RAM loses data stored thereinside once power is turned off. ROM can be further classified into mask ROM, EPROM (Erasable Programmable ROM), EEPROM (Electrically Erasable Programmable ROM), and flash memory. As disclosed in a U.S. Pat. No. 5,514,610, high-energy ion is used to write data in mask ROM. Once data has been written into mask ROM, the user cannot erase or rewrite the data but can only read the data. Therefore, mask ROM normally applies to the products that data is not intended to vary in the future, such as the booting programs for computers/embedded devices, font tables, and programs for game machines. Mask ROM has the advantage of the lowest cost per bit.

Mask ROM normally adopts channel transistors as the memory units and turns on/off the memory units through changing the threshold voltage. In mask ROM, word lines (WL) span bit lines (BL) to form an array structure corresponding to every memory unit, whereby binary data "0" and "1" are written or read. The width of BL and WL and the area of memory units directly influence the size of mask ROM.

At present, mask ROM is usually applied to diverse small-quantity products and normally fabricated with the 6-inch process. The 6-inch process generally adopts the 365 nm I-line exposure machine, which can only fabricate 365 nm wide lines at best. Thus, it is hard for mask ROM to reduce the overall area, increase the memory unit density and promote the storage capacity.

SUMMARY OF THE INVENTION

The primary objective of the present invention is to overcome the problem that the size of mask ROM is hard to further reduce.

To achieve the abovementioned objective, the present invention proposes a mask ROM fabrication method, which comprises steps:

Step 1: forming a gate dielectric layer on a substrate and a first photoresist layer on the gate dielectric layer;

Step 2: letting a light having a wavelength of 365 nm pass through a first phase shift mask to photolithographically form on the first photoresist layer a plurality of first trenches having a width of 243-365 nm and revealing a portion of the gate dielectric layer;

Step 3: doping the substrate to form a plurality of embedded bit lines in the substrate and corresponding to the first trenches;

Step 4: removing the first photoresist layer;

Step 5: forming a polysilicon layer on the gate dielectric layer and a second photoresist layer on the polysilicon layer;

Step 6: letting a light having a wavelength of 365 nm pass through a second phase shift mask to photolithographically form on the second photoresist layer a plurality of second trenches revealing a portion of the polysilicon layer;

Step 7: using an etching process to selectively remove a plurality of sacrifice regions of the polysilicon layer, which are corresponding to the second trenches; and removing the second photoresist layer to form a plurality of polysilicon word lines on the gate dielectric layer.

The present invention uses a light having a wavelength of 365 nm and passing through phase shift masks to fabricate the lines of mask ROM photolithographically and reduce the line width to 243-365 nm, whereby is effectively reduced the size of mask ROM, increased the memory unit density and promoted the storage capacity.

BRIEF DESCRIPTION OF THE DRAWINGS

FIG. 6A is a top view schematically showing the structure formed by Step 5 according to one embodiment of the present invention;

DETAILED DESCRIPTION OF THE PREFERRED EMBODIMENTS

The embodiments are used to describe the technical contents of the present invention in detail in cooperation with the drawings below.

Figure 1A:
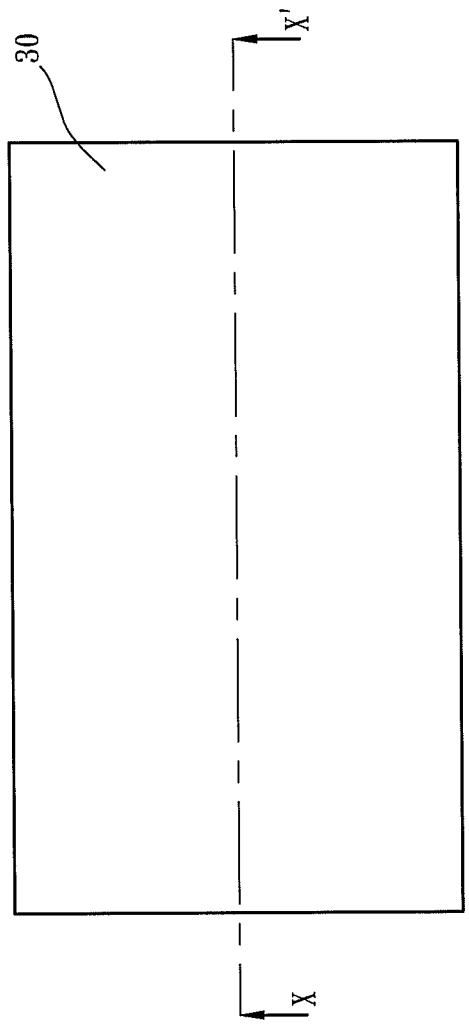
FIG. 1A is a top view schematically showing the structure formed by Step 1 according to one embodiment of the present invention.
Figure 1B:
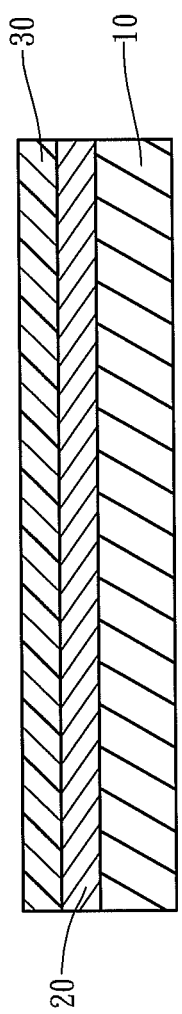
FIG. 1B is a sectional view along Line X-X' in FIG. 1A.

Refer to FIG. 1A and FIG. 1B. The mask ROM fabrication method of the present invention comprises the following steps.

In Step 1, form a gate dielectric layer 20 on a substrate 10 and a first photoresist layer 30 on the gate dielectric layer 20. In one embodiment, the substrate 10 is a silicon substrate doped with a p-type dopant, wherein the p-type dopant is selected from a group consisting of boron, indium, aluminum, and gallium. Silicon dioxide is grown on the substrate 10 to form the gate dielectric layer 20. Next, photoresist is spin-coated on the gate dielectric layer 20 to form the first photoresist layer 30. In this embodiment, the first photoresist layer 30 is exemplified by a positive photoresist layer. However, a negative photoresist may also be used as the material of the first photoresist layer 30 in the present invention.

Figure 2:
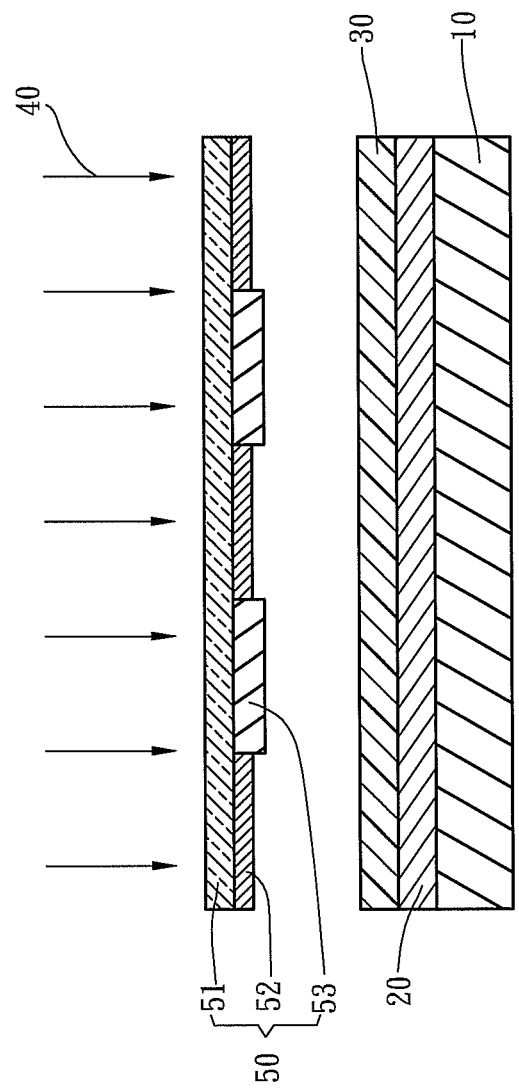
FIG. 2 is a diagram schematically showing exposure in Step 2 according to one embodiment of the present invention.
Figure 3A:
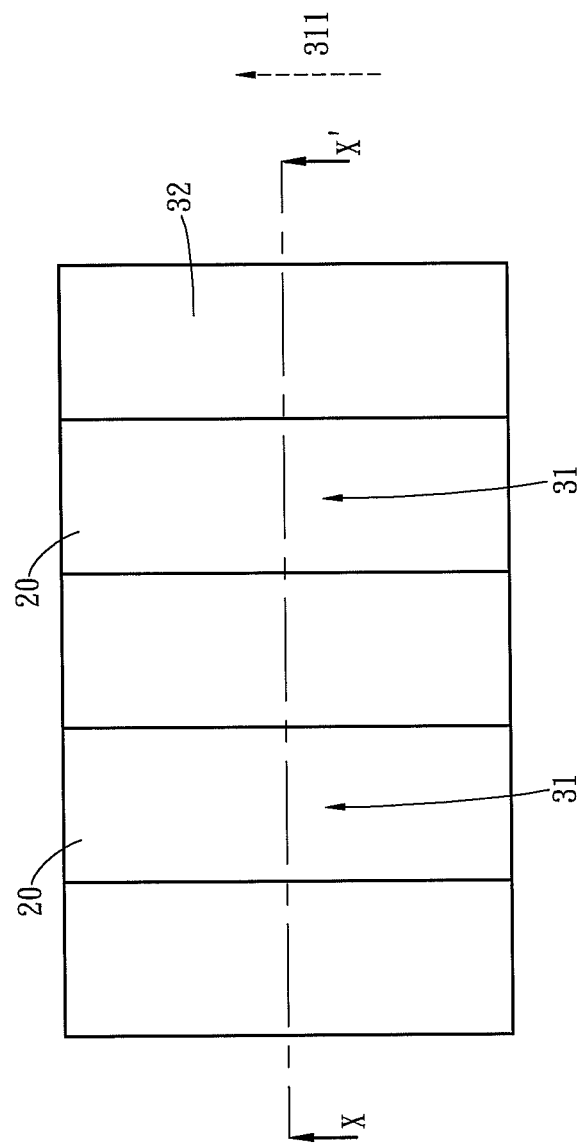
FIG. 3A is a top view schematically showing the structure formed by Step 2 according to one embodiment of the present invention.
Figure 3B:
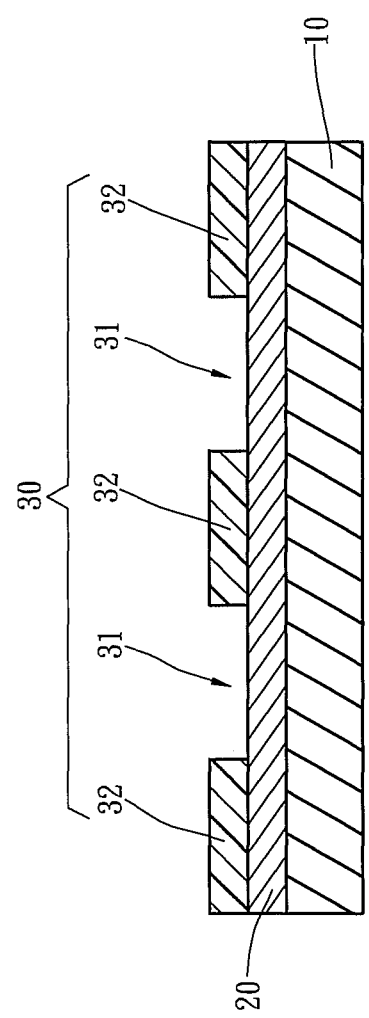
FIG. 3B is a sectional view along Line X-X' in FIG. 3A.

Refer to FIG. 2, FIG. 3A and FIG. 3B. In Step 2, let a light 40 having a wavelength of 365 nm pass through a first phase shift mask 50 to photolithographically form on the first photoresist layer 30 a plurality of first trenches 31 having a width of 243-365 nm and revealing a portion of the gate dielectric layer 20. In one embodiment, the light 40 is emitted by an I-line exposure machine and has a wavelength of 365 nm. The first phase shift mask 50 includes a light-permeable layer 51, a light-shielding layer 52 arranged on the light-permeable layer 51, and a phase-shift layer 53 arranged on the light-permeable layer 51 and adjacent to the light-shielding layer 52. The light-permeable layer 51 is made of quartz. The light-shielding layer 52 is made of chromium. The phase-shift layer 53 is made of a silicide, which is selected from a group consisting of oxides, nitrides, carbides, oxynitrides, oxycarbides, nitrocarbides and oxynitrocarbides of silicide. The first phase shift mask 50 has a first pattern, which matches the first trenches 31 and is to be transferred to the first photoresist layer 30. The first phase shift mask 50 has a 180-degree anti-phase effect on the light 40 passing therethrough, whereby the resolution of exposure is increased, and whereby the first pattern is transferred to the first photoresist layer 30. Next, remove the portion of the first photoresist layer 30, which has been illuminated by the light 40, to form the first trenches 31 parallel to a first axial direction 311. The portion of the first photoresist layer 30, which is preserved, then functions as first barriers 32.

Figure 4A:
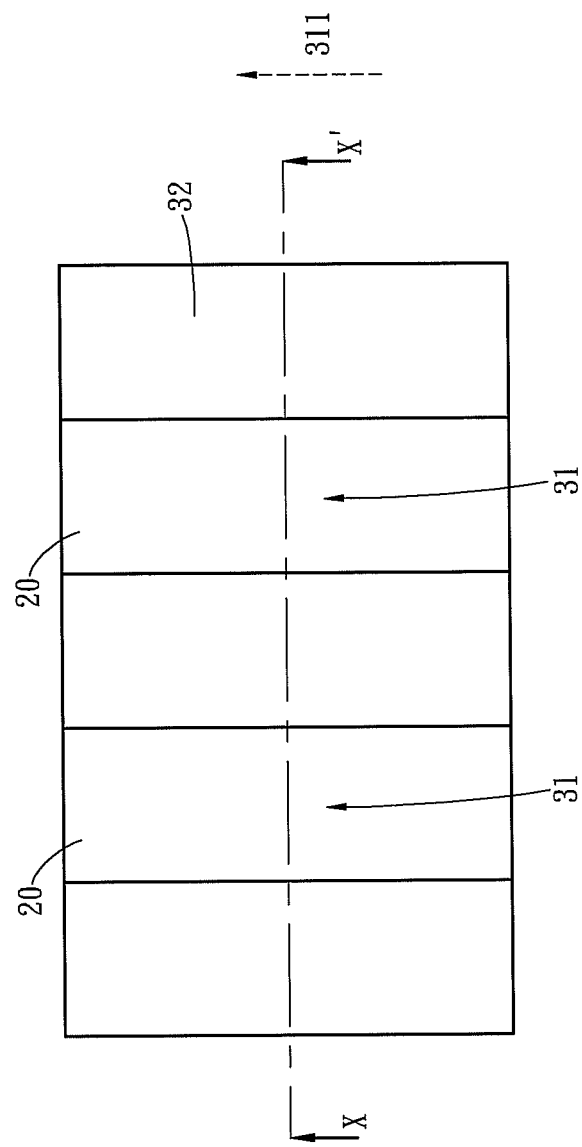
FIG. 4A is a top view schematically showing the structure formed by Step 3 according to one embodiment of the present invention.
Figure 4B:
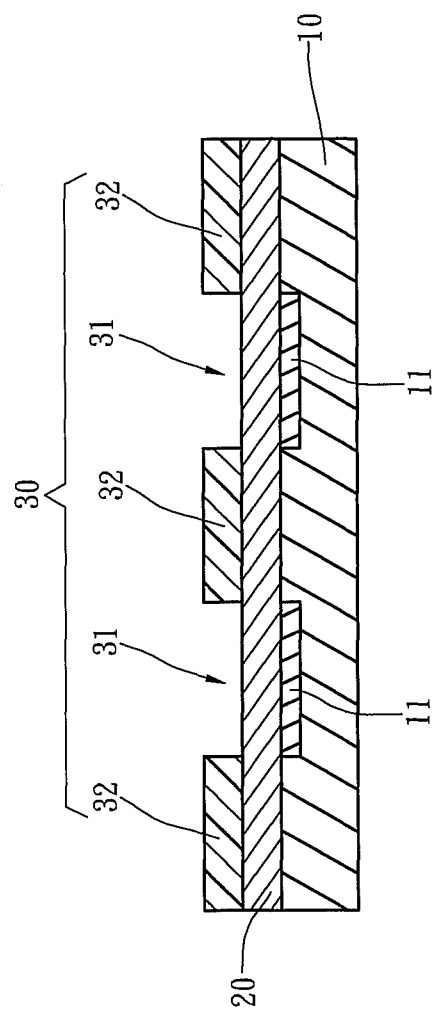
FIG. 4B is a sectional view along Line X-X' in FIG. 4A.

Refer to FIG. 4A and FIG. 4B. In Step 3, dope the substrate 10 to form a plurality of embedded bit lines 11 corresponding to the first trenches 31. In one embodiment, the substrate 10 is doped with an n-type dopant, which is selected from a group consisting of phosphor, arsenic and antimony. During doping, the first barriers 32 prevents the n-type dopant from entering the gate dielectric layer 20, and the first trenches allow the n-type dopant to pass through the gate dielectric layer 20 and enter into the substrate 10 to form the embedded bit lines 11 having a width corresponding to the trenches 31. Then, an annealing process is used to activate the embedded bit lines 11.

Figure 5A:
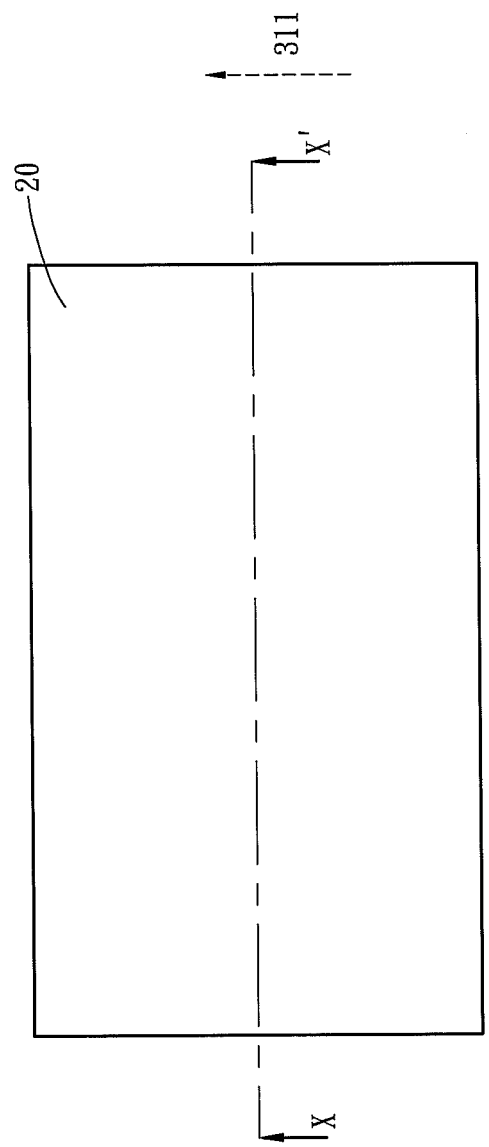
FIG. 5A is a top view schematically showing the structure formed by Step 4 according to one embodiment of the present invention.
Figure 5B:
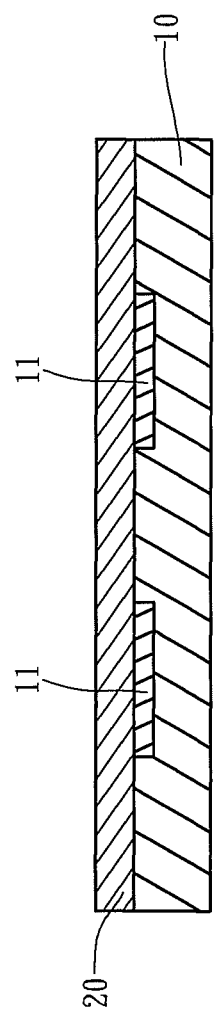
FIG. 5B is a sectional view along Line X-X' in FIG. 5A.

Refer to FIG. 5A and FIG. 5B. In Step 4, remove the first photoresist layer 30.

Figure 6B:
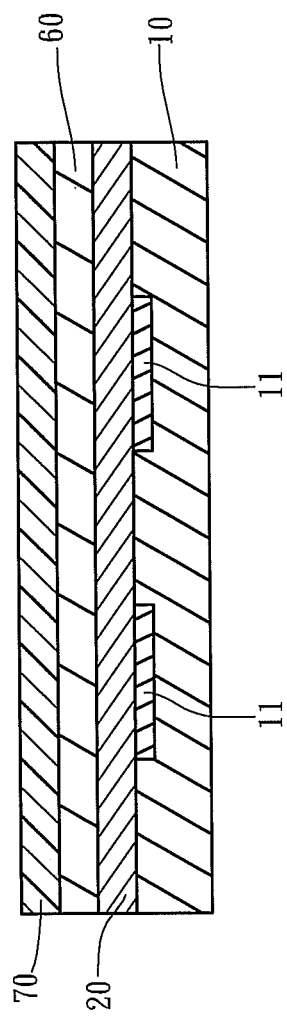
FIG. 6B is a sectional view along Line X-X' in FIG. 6A.
Figure 7:
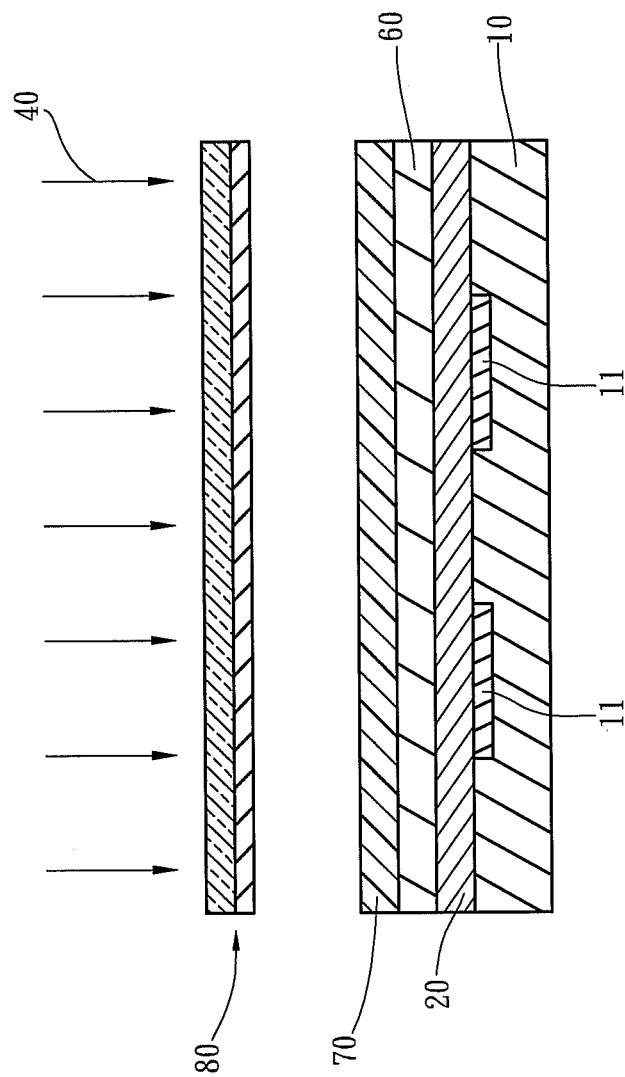
FIG. 7 is a diagram schematically showing exposure in Step 6 according to one embodiment of the present invention.
Figure 8A:
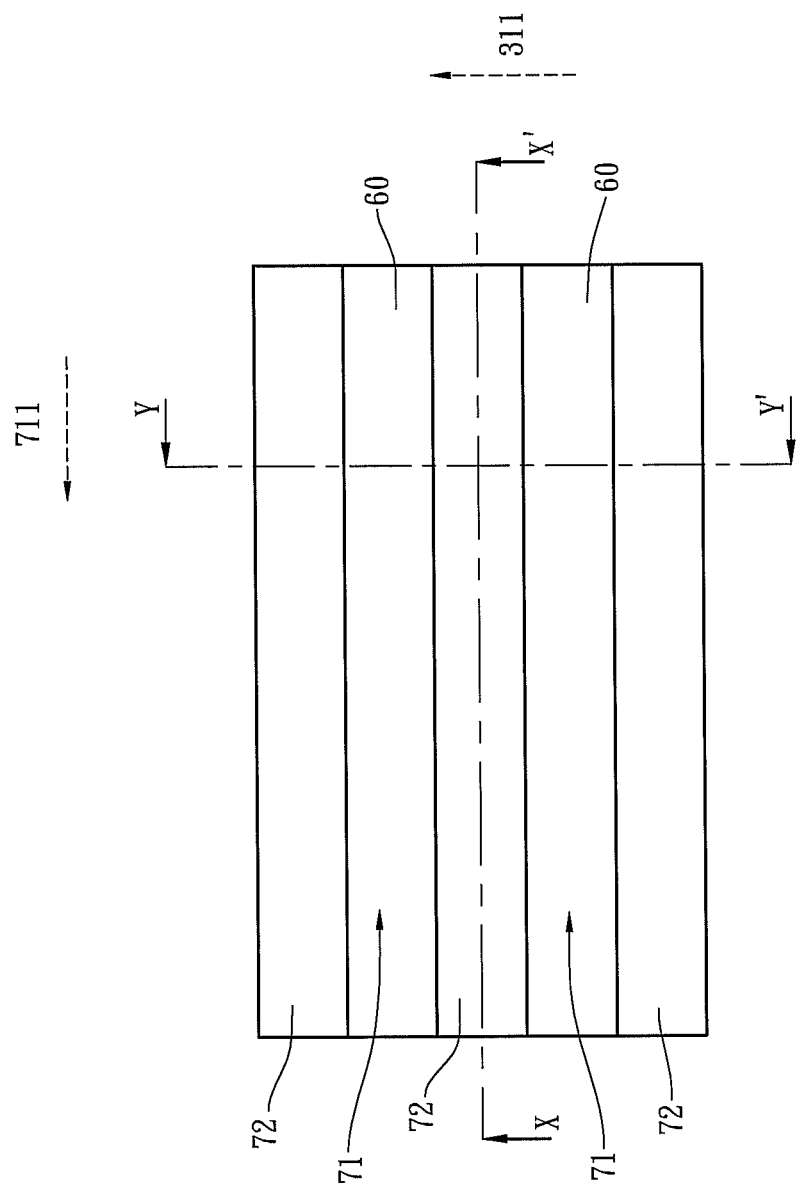
FIG. 8A is a top view schematically showing the structure formed by Step 6 according to one embodiment of the present invention.
Figure 8B:
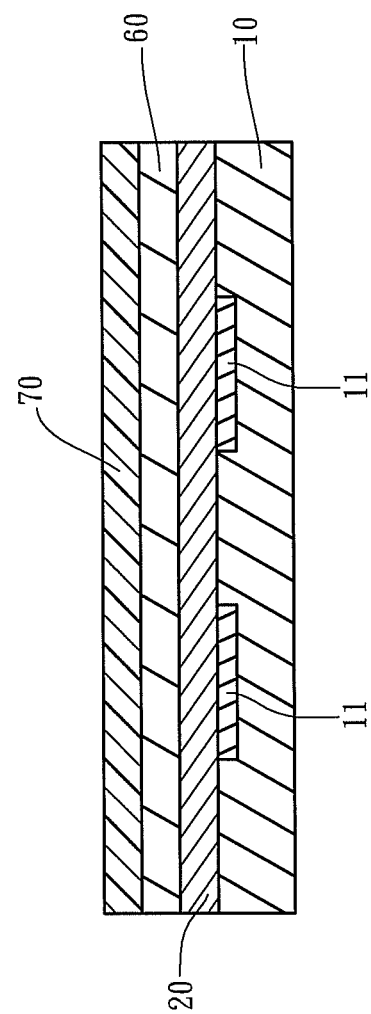
FIG. 8B is a sectional view along Line X-X' in FIG. 8A.
Figure 8C:
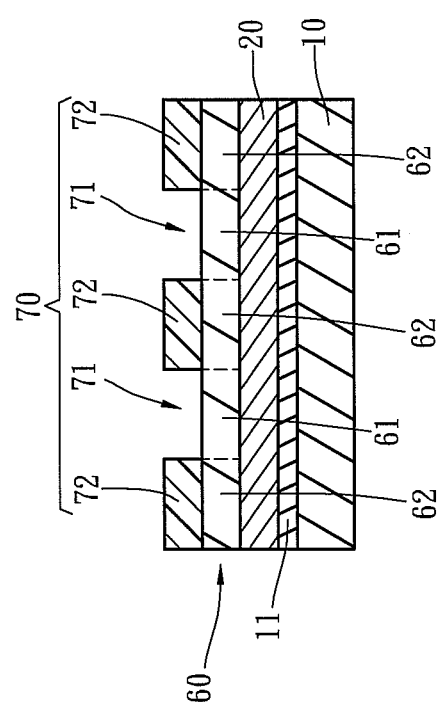
FIG. 8C is a sectional view along Line Y-Y' in FIG. 8A.

Refer to FIG. 6A and FIG. 6B. In Step 5, form a polysilicon layer 60 on the gate dielectric layer 20 and a second photoresist layer 70 on the polysilicon layer 60. In one embodiment, the polysilicon layer 60 is formed on the gate dielectric layer 20 via a CVD (Chemical Vapor Deposition) method, and the second photoresist layer 70 is spin-coated on the polysilicon layer 60. In this embodiment, the second photoresist layer 70 is made of a positive photoresist. However, the second photoresist layer 70 may also be made of a negative photoresist.

Refer to FIG. 7 and FIGS. 8A-8C. In Step 6, let the light 40 pass through a second phase shift mask 80 to photolithographically form on the second photoresist layer 70 a plurality of second trenches 71 revealing a portion of the polysilicon layer 60. In one embodiment, the materials and structure of the second phase shift mask 80 are similar to those of the first phase shift mask 50 except the second phase shift mask 80 has a second pattern, which matches the second trenches 71 and is to be transferred to second photoresist layer 70. The light 40 passes through the second phase shift mask 80 to transfer the second pattern to the second photoresist layer 70. Next, remove a portion of the second photoresist layer 70, which has been illuminated by the light 40, to form the second trenches 71 parallel to a second axial direction 711 and perpendicular to the first axial direction 311. Two adjacent second trenches 71 are separated by a spacing of 243-365 nm. The portion of the second photoresist layer 70, which is preserved, then functions as second barriers 72 having the width of 243-365 nm. The portion of the polysilicon layer 60, which is corresponding to the second trenches 71, is defined to be sacrifice regions 61. The portion of the polysilicon layer 60, which is corresponding to second barriers 72, is defined to be polysilicon word lines 62. If the second photoresist layer 70 is made of a negative photoresist, the second phase shift mask 80 adopts a third pattern, which matches the second barriers 72 having a width of 243-365 nm and is to be transferred to the second photoresist layer 70. The light 40 passing through the second phase shift mask 80 transfers the third pattern to the second photoresist layer 70. The portion of the second photoresist layer 70, which is not illuminated by the light 40, is removed to form the second trenches 71. The portion of the second photoresist layer 70, which is illuminated by the light 40, is preserved to function as the second barriers 72 having the width of 243-365 nm.

Figure 9A:
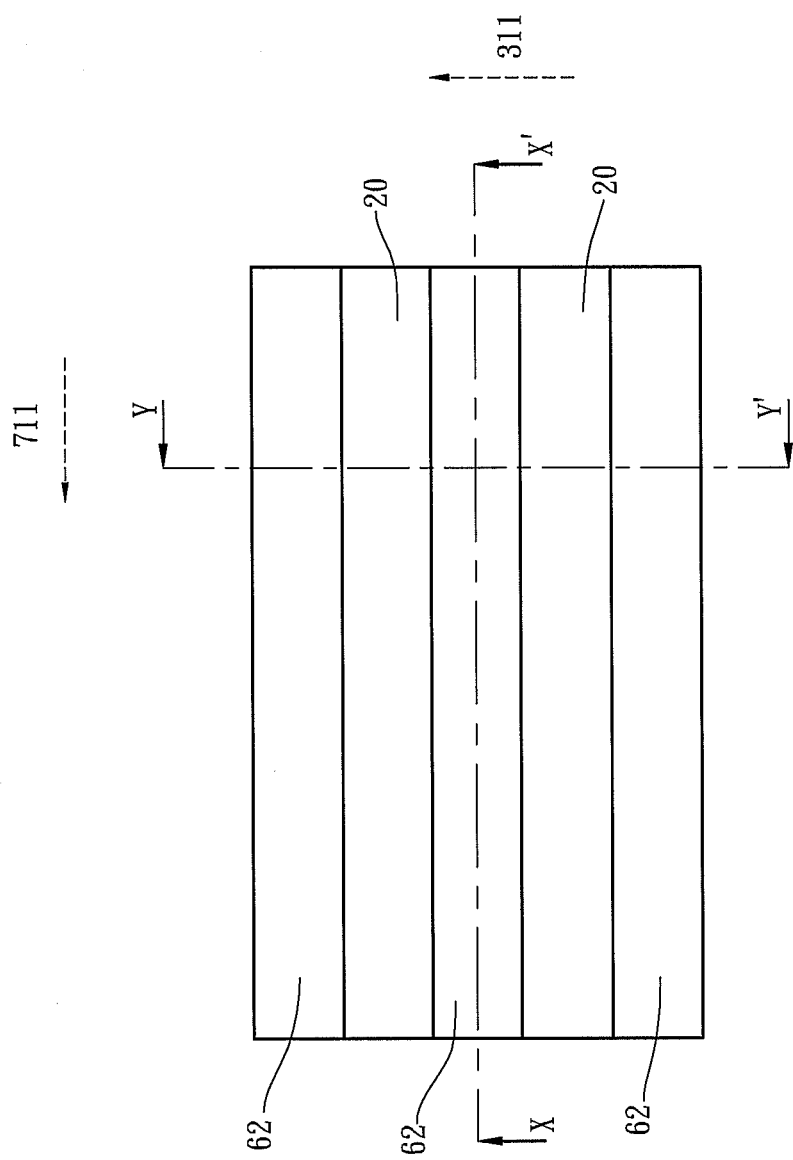
FIG. 9A is a top view schematically showing the structure formed by Step 7 according to one embodiment of the present invention.
Figure 9B:
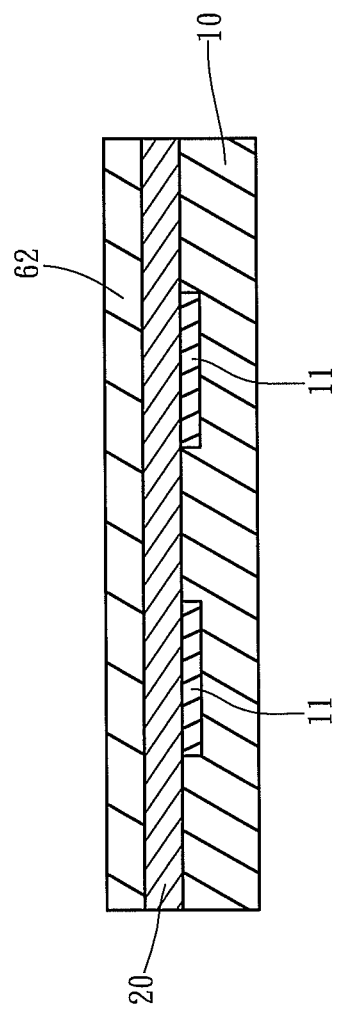
FIG. 9B is a sectional view along Line X-X' in FIG. 9A.
Figure 9C:
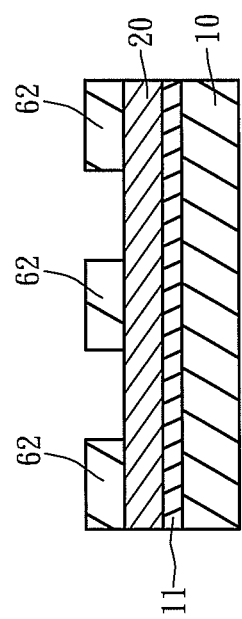
FIG. 9C is a sectional view along Line Y-Y' in FIG. 9A.

Refer to FIGS. 9A-9C. In Step 7, use an etching process to selectively remove a plurality of sacrifice regions 61 of the polysilicon layer 60, which are corresponding to the second trenches 71, and remove the second photoresist layer 70 to form a plurality of polysilicon word lines 62 on the gate dielectric layer 20. In one embodiment, an anisotropic dry etching process is used to remove the sacrifice regions 61 of the polysilicon layer 60, which are not shielded by the second barriers 72. Next, the second barriers 72 are removed to form the polysilicon word lines 62 that have a width corresponding to the second barriers 72 and ranging between 243 and 365 nm.

In conclusion, the present invention lets a light emitted by an I-line exposure machine and having a wavelength of 365 nm pass through the phase shift masks to fabricate the embedded bit lines and the polysilicon word lines of mask ROM photolithographically and reduce the line width to 243-365 nm, whereby is effectively reduced the size of mask ROM, increased the memory unit density, promoted the storage capacity, and prolonged the service life of the lenses of the I-line exposure machine.

The above description has proves that the present invention possesses utility, novelty and non-obviousness and meets conditions for a patent. Thus, the Inventors file the application for a patent. It is appreciated if the patent is approved fast.

The embodiments described above are only to exemplify the present invention but not to limit the scope of the present invention. Any equivalent modification or variation according to the claims stated below is to be also included within the scope of the present invention.

What is claimed is:

1. A mask ROM fabrication method comprising:
   Step 1: forming a gate dielectric layer on a substrate and a first photoresist layer on the gate dielectric layer;
   Step 2: letting a light having a wavelength of 365 nm pass through a first phase shift mask to photolithographically form on the first photoresist layer a plurality of first trenches having a width of 243-365 nm and revealing a portion of the gate dielectric layer;
   Step 3: doping the substrate to form a plurality of embedded bit lines corresponding to the first trenches;
   Step 4: removing the first photoresist layer;
   Step 5: forming a polysilicon layer on the gate dielectric layer and a second photoresist layer on the polysilicon layer;

Step 6: letting the light pass through a second phase shift mask to photolithographically form on the second photoresist layer a plurality of second trenches revealing a portion of the polysilicon layer;

Step 7: using an etching process to selectively remove a plurality of sacrifice regions of the polysilicon layer, which are corresponding to the second trenches, and removing the second photoresist layer to form a plurality of polysilicon word lines on the gate dielectric layer.

2. The mask ROM fabrication method according to claim 1, wherein in Step 1, the substrate is a silicon substrate doped with a p-type dopant which is selected from a group consisting of boron, indium, aluminum and gallium.

3. The mask ROM fabrication method according to claim 1, wherein the gate dielectric layer is made of silicon dioxide.

4. The mask ROM fabrication method according to claim 1, wherein in Step 1, the first photoresist layer is made of a positive photoresist.

5. The mask ROM fabrication method according to claim 1, wherein in Step 3, the substrate is doped with an n-type dopant.

6. The mask ROM fabrication method according to claim 5, wherein the n-type dopant is selected from a group consisting of phosphor, arsenic and antimony.

7. The mask ROM fabrication method according to claim 1, wherein in Step 5, the polysilicon layer is formed with a CVD (Chemical Vapor Deposition) method.

8. The mask ROM fabrication method according to claim 1, wherein in Step 5, the second photoresist layer is made of a positive photoresist.

9. The mask ROM fabrication method according to claim 1, wherein in Step 7, the polysilicon word lines have a width of 243-365 nm.

10. The mask ROM fabrication method according to claim 1, wherein the first trench has a first axial direction, and wherein the second trench has a second axial direction, and wherein the first axial direction is perpendicular to the second axial direction.

* * * * *